(12) United States Patent
Ong (10) Patent No.: US 9,874,414 B1
(45) Date of Patent: Jan. 23, 2018

(54) THERMAL CONTROL SYSTEM

(71) Applicant: Google Inc., Mountain View, CA (US)

(72) Inventor: Tony Ong, San Jose, CA (US)

(73) Assignee: Google LLC, Mountain View, CA (US)

( * ) Notice: Subject to any disclaimer, the term of this patent is extended or adjusted under 35 U.S.C. 154(b) by 815 days.

(21) Appl. No.: 14/099,098

(22) Filed: Dec. 6, 2013

(51) Int. Cl.
*F28F 27/00* (2006.01)

(52) U.S. Cl.
CPC .................................. *F28F 27/00* (2013.01)

(58) Field of Classification Search
CPC ....................................................... F28F 27/00
USPC .......................................................... 454/184
See application file for complete search history.

(56) References Cited

U.S. PATENT DOCUMENTS

| 4,407,185 | A | 10/1983 | Haines et al. |
| 5,119,014 | A | 6/1992 | Kronberg |
| 5,317,859 | A | 6/1994 | Schneider et al. |
| 5,458,991 | A | 10/1995 | Severinsky |
| 5,565,274 | A | 10/1996 | Perrone, Jr. et al. |
| 5,595,068 | A | 1/1997 | Amr |
| 5,596,844 | A | 1/1997 | Kalinowski |
| 5,691,883 | A | 11/1997 | Nelson |
| 5,694,307 | A | 12/1997 | Murugan |
| 5,722,886 | A | 3/1998 | Steckly |
| 5,746,950 | A | 5/1998 | Villanueva |
| 5,844,884 | A | 12/1998 | Szlenski |
| 6,009,177 | A | 12/1999 | Sudia |
| 6,034,873 | A | 3/2000 | Stanghl et al. |
| 6,138,413 | A | 10/2000 | Fehr |
| 6,249,221 | B1 | 6/2001 | Reed |
| 6,289,684 | B1 | 9/2001 | Guidry, II et al. |
| 6,290,024 | B1 | 9/2001 | Ehlert |
| 6,374,627 | B1 | 4/2002 | Schumacher et al. |
| 6,429,706 | B1 | 8/2002 | Amin et al. |

(Continued)

FOREIGN PATENT DOCUMENTS

| CN | 2687732 Y | 3/2005 |
| CN | 1732727 A | 2/2006 |

(Continued)

OTHER PUBLICATIONS

Cringley, Robert, "Google-Mart: Sam Walton Taught Google More About How to Dominate the Internet Than Microsoft Ever Did," I, Cringely—The Pulpit, Nov. 17, 2005, 3 pages.

(Continued)

*Primary Examiner* — Vivek Shirsat
(74) *Attorney, Agent, or Firm* — Honigman Miller Schwartz and Cohn LLP (57) ABSTRACT

A thermal control system includes a chassis, one or more temperature sensors, a chassis controller, and an air mover module. The one or more temperature sensors and the air mover module are disposed on the chassis. The chassis controller is in communication with the one or more temperature sensors. The air mover module includes an air mover and an air controller. The air controller is in communication with the air mover, the one or more temperature sensors, and the chassis controller. In addition, the air controller receives periodic heartbeat signals from the chassis controller while the chassis controller operates in a healthy state. The chassis controller controls the air mover based on temperature signals of the one or more temperature sensors while operating in its healthy state.

23 Claims, 5 Drawing Sheets

(56) References Cited

U.S. PATENT DOCUMENTS

| | | |
|---|---|---|
| 6,496,366 B1 | 12/2002 | Coglitore et al. |
| 6,504,717 B1 | 1/2003 | Heard |
| 6,506,111 B2 | 1/2003 | Sharp et al. |
| D473,225 S | 4/2003 | Coglitore |
| 6,563,706 B1 | 5/2003 | Strickler |
| D475,705 S | 6/2003 | Coglitore et al. |
| 6,584,559 B1 | 6/2003 | Huh et al. |
| 6,587,343 B2 | 7/2003 | Novotny et al. |
| 6,652,373 B2 | 11/2003 | Sharp et al. |
| 6,652,374 B2 | 11/2003 | Sharp et al. |
| 6,667,891 B2 | 12/2003 | Coglitore et al. |
| 6,668,565 B1 | 12/2003 | Johnson et al. |
| 6,672,955 B2 | 1/2004 | Charron |
| 6,704,196 B1 | 3/2004 | Rodriguez et al. |
| 6,741,467 B2 | 5/2004 | Coglitore et al. |
| 6,747,872 B1 | 6/2004 | Patel et al. |
| 6,768,222 B1 | 7/2004 | Ricks |
| 6,822,859 B2 | 11/2004 | Coglitore et al. |
| 6,824,362 B2 | 11/2004 | Dodson, III |
| 6,850,408 B1 | 2/2005 | Coglitore et al. |
| 6,859,366 B2 | 2/2005 | Fink |
| 6,867,967 B2 | 3/2005 | Mok |
| 6,880,349 B2 | 4/2005 | Johnson et al. |
| 6,896,612 B1 | 5/2005 | Novotny |
| 6,904,968 B2 | 6/2005 | Beitelmal et al. |
| 6,927,980 B2 | 8/2005 | Fukuda et al. |
| 6,935,130 B2 | 8/2005 | Cheng et al. |
| 6,937,947 B2 | 8/2005 | Trembley |
| 6,967,283 B2 | 11/2005 | Rasmussen et al. |
| 6,969,922 B2 | 11/2005 | Welches et al. |
| 6,980,433 B2 | 12/2005 | Fink |
| 7,011,576 B2 | 3/2006 | Sharp et al. |
| 7,046,514 B2 | 5/2006 | Fink et al. |
| 7,106,411 B2 | 9/2006 | Read et al. |
| 7,123,477 B2 | 10/2006 | Coglitore et al. |
| 7,145,772 B2 | 12/2006 | Fink |
| 7,168,935 B1 | 1/2007 | Taminger et al. |
| 7,173,821 B2 | 2/2007 | Coglitore |
| 7,214,843 B2 | 5/2007 | Beech, Jr. et al. |
| 7,278,273 B1 | 10/2007 | Whitted et al. |
| 7,382,613 B2 | 6/2008 | Vinson et al. |
| 7,500,911 B2 | 3/2009 | Johnson et al. |
| 7,525,207 B2 | 4/2009 | Clidaras et al. |
| 7,599,194 B2 | 10/2009 | Sheffield |
| 7,604,535 B2 | 10/2009 | Germagian et al. |
| 7,646,590 B1 | 1/2010 | Corhodzic et al. |
| 7,663,502 B2 | 2/2010 | Breed |
| 7,701,714 B2 | 4/2010 | Shabany |
| 7,752,858 B2 | 7/2010 | Johnson et al. |
| 7,841,381 B2 | 11/2010 | Chagnot et al. |
| 2002/0005329 A1 | 1/2002 | Sugata et al. |
| 2002/0007643 A1 | 1/2002 | Spinazzola et al. |
| 2003/0002254 A1 | 1/2003 | Faneuf et al. |
| 2003/0063437 A1 | 4/2003 | Kurihara |
| 2003/0133263 A1 | 7/2003 | Shu |
| 2003/0150231 A1 | 8/2003 | Spinazzola et al. |
| 2003/0181158 A1 | 9/2003 | Schell et al. |
| 2003/0197428 A1 | 10/2003 | Hatton et al. |
| 2003/0209023 A1 | 11/2003 | Spinazzola et al. |
| 2003/0237008 A1 | 12/2003 | Freevol et al. |
| 2004/0006546 A1 | 1/2004 | Wedlake et al. |
| 2004/0020224 A1 | 2/2004 | Bash et al. |
| 2004/0020232 A1 | 2/2004 | Marquardt |
| 2004/0040695 A1 | 3/2004 | Chesser et al. |
| 2004/0073833 A1 | 4/2004 | Krishnamurthy et al. |
| 2004/0073834 A1 | 4/2004 | Kermaani et al. |
| 2004/0090787 A1 | 5/2004 | Dowling et al. |
| 2004/0095249 A1 | 5/2004 | Zaccaria |
| 2004/0099747 A1 | 5/2004 | Johnson et al. |
| 2004/0105758 A1 | 6/2004 | Ross |
| 2004/0130868 A1* | 7/2004 | Schwartz ............... G06F 1/20 361/679.48 |
| 2004/0150374 A1 | 8/2004 | Kraus |
| 2005/0012395 A1 | 1/2005 | Eckroad et al. |
| 2005/0036248 A1 | 2/2005 | Klikic et al. |
| 2005/0088201 A1 | 4/2005 | Devlin et al. |
| 2005/0099750 A1 | 5/2005 | Takahashi et al. |
| 2005/0148827 A1* | 7/2005 | Chen ............... A61B 5/02438 600/300 |
| 2005/0168945 A1 | 8/2005 | Coglitore |
| 2005/0170770 A1 | 8/2005 | Johnson et al. |
| 2005/0225936 A1 | 10/2005 | Day |
| 2005/0259392 A1 | 11/2005 | Vinson et al. |
| 2005/0280986 A1 | 12/2005 | Coglitore et al. |
| 2006/0020832 A1 | 1/2006 | Hung |
| 2006/0065000 A1 | 3/2006 | Belady |
| 2006/0082263 A1 | 4/2006 | Rimier et al. |
| 2006/0129367 A1* | 6/2006 | Mishra ............... H04L 43/0817 703/13 |
| 2006/0139877 A1 | 6/2006 | Germagian et al. |
| 2007/0097636 A1 | 5/2007 | Johnson et al. |
| 2007/0254583 A1 | 11/2007 | Germagian et al. |
| 2008/0055848 A1 | 3/2008 | Hamburger et al. |
| 2009/0055665 A1 | 2/2009 | Maglione et al. |
| 2009/0241578 A1 | 10/2009 | Carlson et al. |
| 2012/0116590 A1* | 5/2012 | Florez-Larrahondo . G06F 1/206 700/275 |
| 2012/0131361 A1 | 5/2012 | Chang |
| 2012/0203393 A1 | 8/2012 | Dumitru et al. |
| 2013/0151646 A1 | 6/2013 | Chidambaram et al. |
| 2013/0205341 A1* | 8/2013 | Jabara ............... H04W 4/008 725/39 |

FOREIGN PATENT DOCUMENTS

| | | |
|---|---|---|
| EP | 621451 A3 | 8/1995 |
| WO | WO-2007082351 A1 | 7/2007 |

OTHER PUBLICATIONS

Greg Matter Weblog, The Industrial Revolution, Finally, available at: http://blogs.sun.com/Gregp/200610, Oct. 17, 2006, 5 pages.

Hamilton, James, "An Architecture for Modular Data Centers" Microsoft Corp, CIDR 2007. 3rd Biennial Conference on Innovative Data Systems Research (CIDR) Jan. 7-10, 2007, Asilomar, California, USA pp. 306-313.

Hamilton, James, "Commodity Data Center Design" Microsoft Corp, Apr. 17, 2007, 11 pgs.

Shankland, Stephen, "Sun Blackbox, meet APC's whitebox," cNet News.com, available at http://news.com/Sun+Blackbox%2C+meet+APCs+whitebox/2001-1010_3-617774.html, Jan. 7, 2007, 2 pages.

"Circuit Converts PWM Fan Drive to Linear and Reduces Acoustic Noise" [online]. Maxim/Dallas Semiconductor, 2006, [retrieved on Oct. 23, 2006]. Retrieved from the Internet: <URL: www.maxim-ic.com/appnotes.cfm/an_pk/3530, 3 pages.

International Preliminary report on Patentability in International Application No. PCT/US2006/25613, dated Dec. 18, 2008, 5 pages.

International Preliminary report on Patentability in International Application No. PCT/US2006/24845, dated Dec. 18, 2008, 7 pages.

International Preliminary report on Patentability in International Application No. PCT/US2006/24844, dated Dec. 18, 2008, 6 pages.

International Search Report and Written Opinion in International Application No. PCT/US2006/24844, dated Apr. 26, 2007, 10 pp.

International Search Report and Written Opinion in International Application No. PCT/US2006/24845, dated Dec. 18, 2006, 9 pages.

International Search Report and Written Opinion in International Application No. PCT/US2006/24880, dated Feb. 15, 2008, 14 pages.

International Search Report and Written Opinion in International Application No. PCT/US2006/039928, dated Jul. 31, 2007, 8 pages.

International Search Report and Written Opinion in International Application No. PCT/US2006/039715, dated Nov. 5, 2007, 12 pages.

International Search Report and Written Opinion in International Application No. PCT/US2006/25163, dated May 3, 2007, 8 pages.

* cited by examiner

THERMAL CONTROL SYSTEM

TECHNICAL FIELD

This disclosure relates to thermal control systems.

BACKGROUND

Fiber optic communication is an emerging method of transmitting information from a source (transmitter) to a destination (receiver) using optical fibers as the communication channel. Optical fibers are flexible, transparent fibers made of thin glass silica or plastic that transmits light throughout the length of the fiber between the source and the destination. Fiber optic communications allows for the transmission of data over longer distances and at higher bandwidth than other known forms of communications.

High density access equipment, such as an optical line terminal (OLT), for fiber optic communications generally does not have systems that manage temperatures of the equipment in an event of a system fault. The access equipment typically has a basic thermal control system, which is managed by a management control card through an $I^2C$ communication bus and protocol. $I^2C$ is a simple two wire interface bus allowing multiple masters and slaves to communicate on two signals SCL (serial clock) and SDA (serial data). A multi-master implementation is extremely difficult, so most designs allow only one master. Even in a single master design, there are potential bus contentions, protocol, and timing violations from either the master or slave devices that may cause the bus to become unresponsive.

Some designs try to work around this issue by adding a reset control line to cycle the state of the slave devices. After a reset, any controller cards of the thermal control system require initialization and programming, such as reading system temperatures and reprogramming fan speeds. In the initialization period (dead time), the system can over heat, trigger alarms, and shut down. As OLT equipment becomes more complex, dense in port counts, a system shut down could vastly impact many thousands of users; and repair time could take up to many hours.

SUMMARY

One aspect of the disclosure provides a system that includes a chassis, one or more temperature sensors, a chassis controller, and an air mover module. The one or more temperature sensors and the air mover module are disposed on the chassis. The chassis controller is in communication with the one or more temperature sensors. The air mover module includes an air mover and an air controller. The air controller is in communication with the air mover, the one or more temperature sensors, and the chassis controller. In addition, the air controller receives periodic heartbeat signals from the chassis controller while the chassis controller operates in a healthy state. The chassis controller controls the air mover based on temperature signals of the one or more temperature sensors while operating in its healthy state.

Implementations of the disclosure may include one or more of the following features. In some implementations, the air controller takes control of the air mover when the air controller fails to receive any heartbeat signals from the chassis controller for a failure threshold period of time. The air controller determines a target air flow rate based on one or more temperature signals of the one or more temperature sensors to maintain a threshold temperature of an air volume of the chassis, and it adjusts an air flow of the air mover to move air at the target air flow rate.

In some implementations, the system further includes non-transitory memory that stores temperature signals of the one or more temperature sensors. The air controller accesses the one or more temperature signals from the non-transitory memory. The chassis controller may obtain temperature signals of the one or more temperature sensors from the memory and may determine the target air flow rate based on the one or more temperature signals to maintain the threshold temperature of the air volume of the chassis. Additionally, the chassis controller may adjust an air flow of the air mover to move air at the target air flow rate, and it may send a heartbeat signal to the air controller.

The air controller may relinquish control of the air mover back to the chassis controller after receiving a heartbeat signal again from the chassis controller. In some examples, the air controller relinquishes control of the air mover to the chassis controller after receiving periodic heartbeat signals again from the chassis controller for a resume threshold period of time. In some implementations, the air controller sends an acknowledgement signal to the chassis controller in response to receiving a heartbeat signal.

The air controller and the chassis controller may share a temperature policy of maintaining a temperature of an air volume of the chassis within a threshold temperature range by adjusting an air flow of the air mover. The air controller may receive the temperature policy from the chassis controller.

The air controller may additionally monitor temperature signals of the one or more temperature sensors and may take control of the air mover when a temperature of an air volume of the chassis is outside a threshold temperature range. The air controller may also determine a target air flow rate based on the one or more temperature signals to maintain a threshold temperature of an air volume of the chassis and may adjust an air flow of the air mover to move air at the target air flow rate. In some examples, the air controller relinquishes control of the air mover to the chassis controller after receiving a heartbeat signal from the chassis controller or periodically receiving heartbeat signals for a resume threshold period of time from the chassis controller, and the temperature of the air volume of the chassis is within the threshold temperature range. The air controller accesses one or more temperature signals from non-transitory memory that stores the temperature signals of the one or more temperature sensors. The chassis controller may access one or more temperature signals from the memory and may determine a target air flow rate based on the one or more temperature signals to maintain a threshold temperature of an air volume of the chassis. Additionally, the chassis controller may adjust an air flow of the air mover to move air at the target air flow rate and may send a heartbeat signal to the air controller.

Another aspect of the disclosure provides a method of temperature control. The method includes receiving periodic heartbeat signals from a chassis controller. The chassis controller only sends heartbeat signals while operating in a healthy state. The chassis controller controls an air flow of an air mover of a chassis to maintain a threshold temperature of an air volume of the chassis. In response to failing to receive a heartbeat signal from the chassis controller for a failure threshold period of time, the method includes determining a target air flow rate based on one or more temperature signals of temperature sensors disposed on the chassis to maintain the threshold temperature and adjusting the air flow of the air mover to move air at the target air flow rate.

In some implementations, in response to failing to receive a heartbeat signal from the chassis controller for a failure threshold period of time, the method includes adjusting the air flow of the air mover to move air to maintain a temperature of the air volume of the chassis within a threshold temperature range and/or the method includes obtaining the temperature signals from non-transitory memory, where the memory stores temperature signals of the one or more temperature sensors. The method may include sending an acknowledgement signal to the chassis controller in response to receiving a heartbeat signal.

After failing to receive a heartbeat signal from the chassis controller for a failure threshold period of time, the method may relinquish control of the air mover to the chassis controller after receiving a heartbeat signal from the chassis controller. The method may further include relinquishing control of the air mover to the chassis controller after receiving a heartbeat signal from the chassis controller for a resume threshold period of time.

In some implementations, the method includes sharing a temperature policy with the chassis controller of maintaining the threshold temperature of the air volume of the chassis within a threshold temperature range by adjusting an air flow of the air mover. The method may further include receiving the temperature policy from the chassis controller.

The method may include monitoring temperature signals of the one or more temperature sensors and taking control of the air mover when a temperature of the air volume of the chassis is outside a threshold temperature range. The method may also include determining a target air flow rate based on the one or more temperature signals to maintain the threshold temperature of the air volume of the chassis and adjusting an air flow of the air mover to move air at the target air flow rate. In some examples, the method further includes relinquishing control of the air mover to the chassis controller after receiving a heartbeat signal from the chassis controller or periodically receiving heartbeat signals for a resume threshold period of time from the chassis controller, and the temperature of the air volume of the chassis is within the threshold temperature range.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1A:
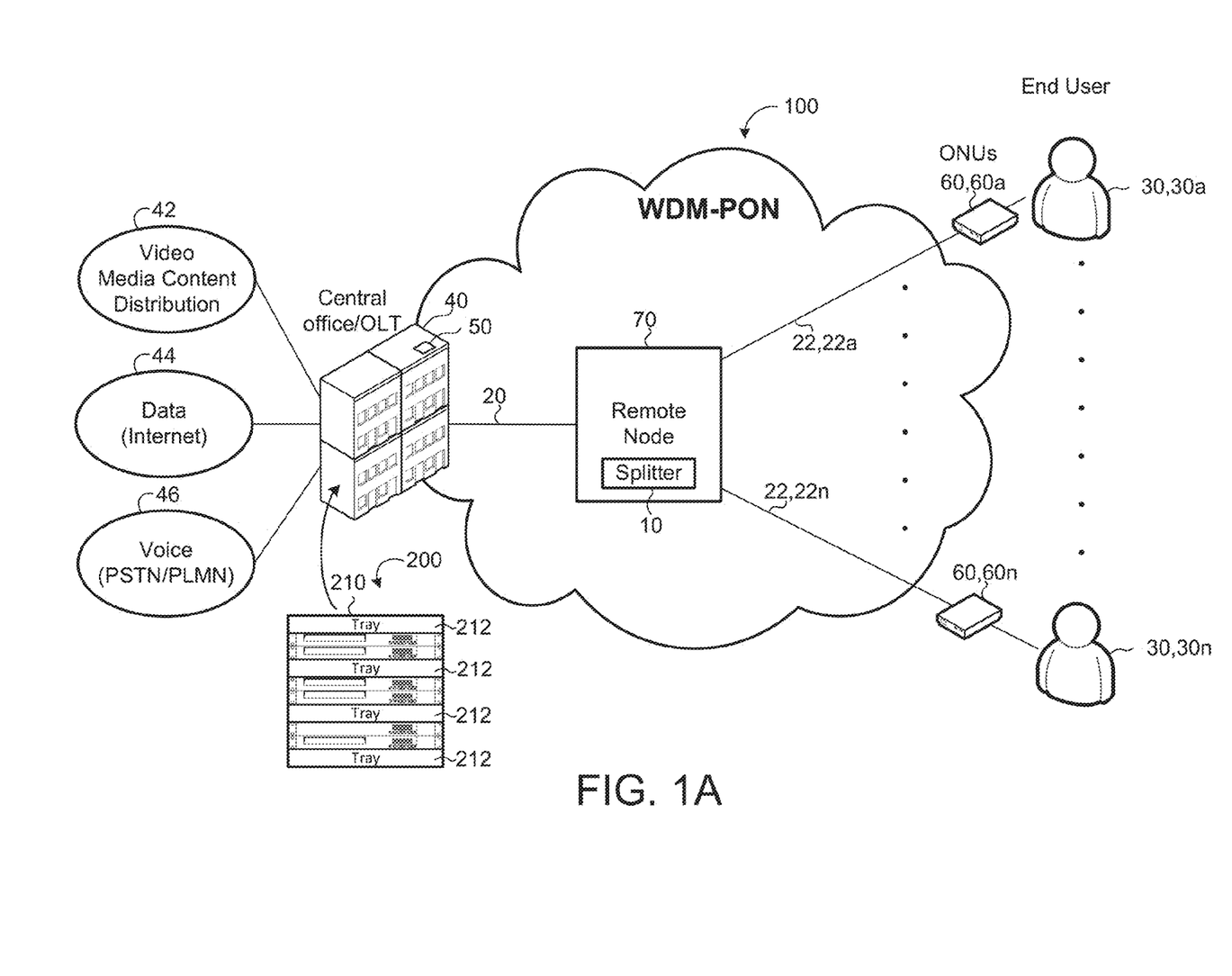
FIG. 1A is a schematic view of an exemplary optical network using an exemplary thermal control system.

Fiber-to-the-home (FTTH) is the delivery of a communication signal through optical fibers from a central office (CO) or optical line terminal (OLT) to a home or a business of a user. Referring to FIG. 1, a passive optical network (PON) 100 is a point-to-multipoint network architecture that uses optical splitters 10 to enable a single optical fiber feeder 20 to serve multiple users 30a-30n (e.g. 16-128). The PON 100 provides optical signals from the CO 40 and includes an optical line terminal 50 (e.g., optical transmitter/receiver or transceiver) to a number of optical network units/terminals (ONUs) 60. Each ONU 60 includes an optical transmitter/receiver (i.e., transceiver) for transmitting and receiving data from the CO 40. In some examples, the PON 100 includes multiple optical transmitter/receiver or transceiver systems 50. One feeder fiber 20 is sent from the CO 40 to a remote node 70, where the signal is split and distributed to many (e.g., 16, 205 or more) different ONUs 60a-60n via fiber feeders 22, 22a-22n.

The CO 40 receives information, such as video media distribution 42, internet data 44, and voice data 46 that may be transferred to the end users 30. The CO 40 includes an OLT 50 connecting the optical access network to an IP, ATM, or SONET backbone, for example. Therefore, the OLT 50 is the endpoint of the PON 100 and converts the electrical signals used by a service provider's equipment and the fiber optic signals used by the PON 100. In addition, the OLT 50 coordinates multiplexing between the conversion devices at the user end 30. The OLT 50 sends the fiber optic signal through a feeder fiber 20, and the signal is received by a remote node 70, which demultiplexes the signal and distributes it to multiple users 30.

Referring to FIGS. 1A-3, the OLT 50 is a high port density terminal and includes a thermal control system 200 that actively maintains and manages the temperature of the OLT 50. The thermal control system 200 includes a chassis 210, one or more temperature sensors 220, a chassis controller 230, and an air mover module 240. The one or more temperature sensors 220 and the air mover module 240 are disposed on the chassis 210. The chassis controller 230 is in communication with the one or more temperature sensors 220 (e.g., 2, 3, 4 etc.). The air mover module 240 includes an air mover 242 (e.g., a fan) and an air controller 244. The air controller 244 is in communication with the air mover 242, the one or more temperature sensors 220, and the chassis controller 230. The air controller 244 may be a microcontroller (e.g., 8-bit microcontroller with 32 kilobyte flash ROM and 512 bytes RAM) having a processor core, a non-transitory memory, and programmable input/output peripherals. The air controller 244 receives periodic heartbeat signals 232 (e.g., every few seconds, such as 2-10 seconds) from the chassis controller 230, while the chassis controller 230 operates in a healthy state. A healthy state of the chassis controller 230 indicates that the controller 230 has no failures or system faults. The chassis controller 230 controls the air mover 242 based on temperature signals 252 of the one or more temperature sensors 220 while operating in its healthy state. The chassis controller 230 controls the air mover 242 by sending control signals 231 to the air mover 231. In addition, the chassis controller 230 ceases the delivery of heartbeat signals 232 to the air controller 244 while operating in an unhealthy state or non-operational.

Figure 1B:
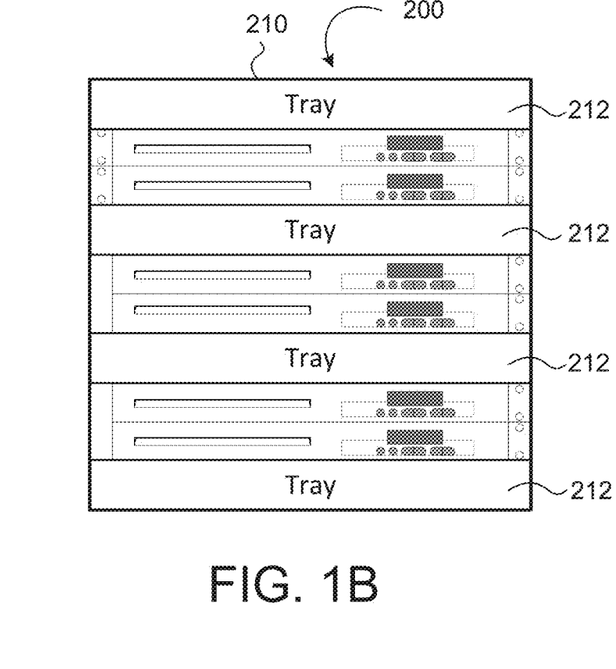
FIG. 1B is a schematic view of the exemplary thermal control system of FIG. 1A.
Figure 1C:
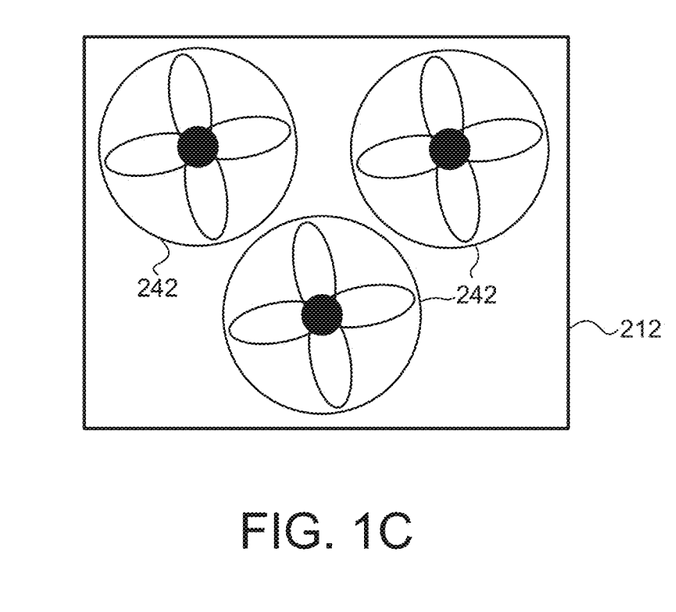
FIG. 1C is a top view of an exemplary tray of the thermal control system of FIG. 1B showing the air movers.
Figure 2:
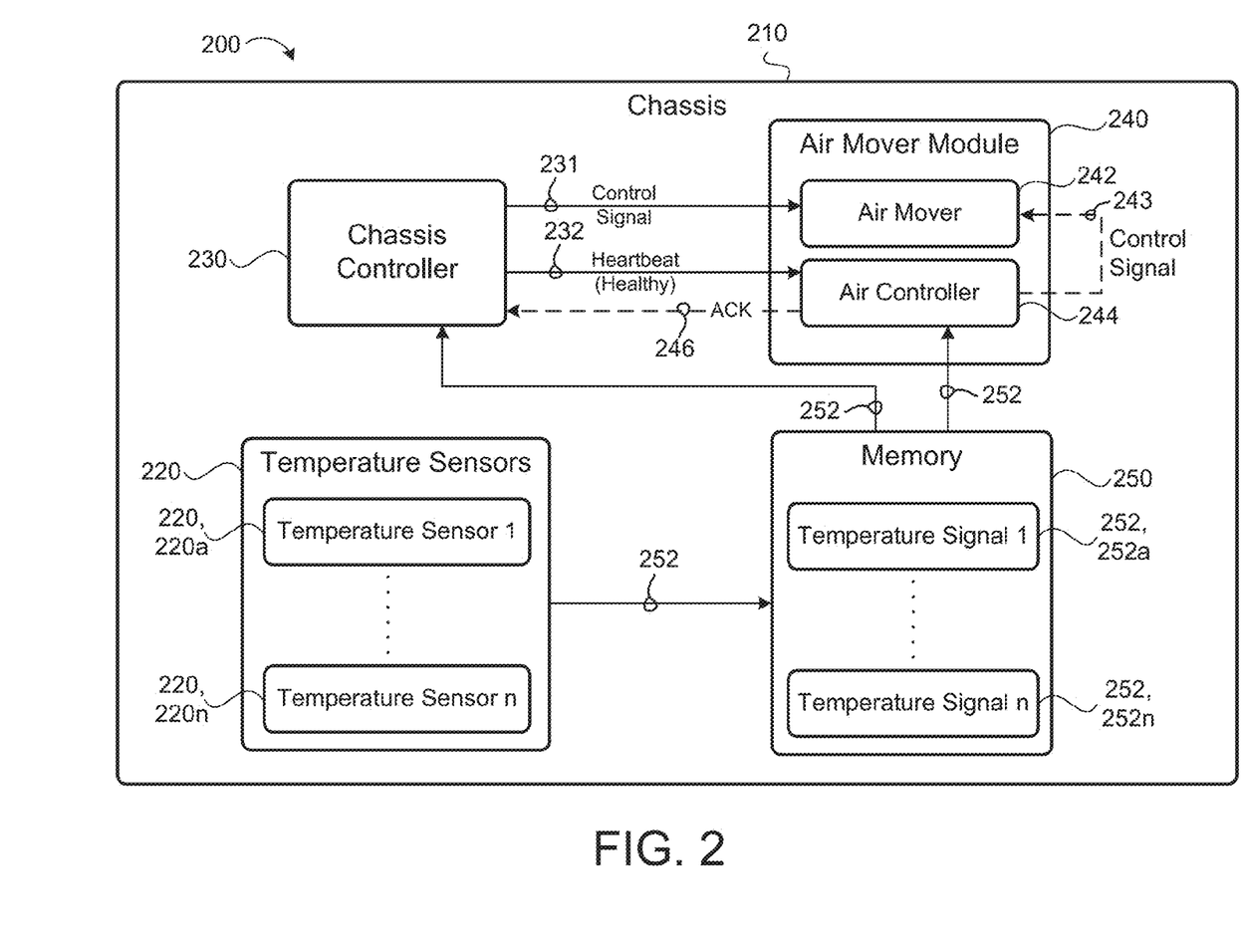
FIG. 2 is a schematic view of an exemplary thermal control system.
Figure 3:
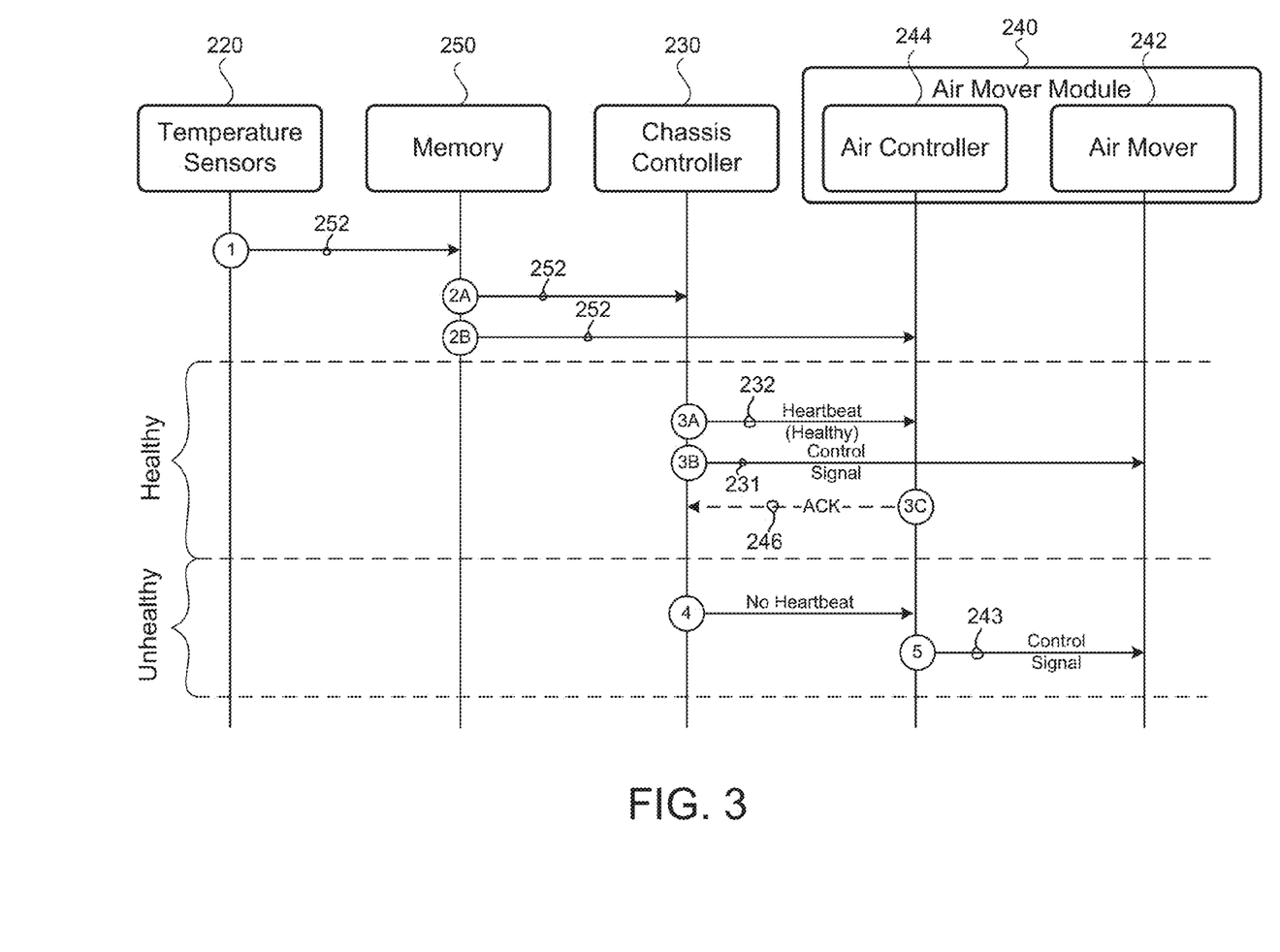
FIG. 3 is a schematic view of the communication within an exemplary thermal control system.

In some implementations, the thermal control system 200 includes one or more trays 212 and each tray 212 includes one or more air movers 242. As shown in FIGS. 1B and 1C, the thermal control system 200 may include four trays 212, each including three air movers 242. In some examples, the trays 212 are releasably removed from the chassis 210 when one or more fans 242 need maintenance or replacement. The fan 242 moves through the chassis 210 to cool the chassis 210 and its components.

When the air controller 244 fails to receive any heartbeat signals 232 from the chassis controller 230 for a failure threshold period of time (e.g., 2, 5, 30, or 60 seconds), the air controller 244 takes control of the air mover 242 and sends the air mover 242 control signals 243. The air controller 244 determines a target air flow rate based on one or more temperature signals 252 of the one or more temperature sensors 220 to maintain a threshold temperature of an air volume of the chassis 210, and it adjusts an air flow of the air mover 242 to move air at the target air flow rate. Therefore, the system 200 provides redundant temperature controllers, the chassis controller 230 and the air controller 244, where the chassis controller 230 is the chassis 210 temperature controller, and the air controller 244 controls the temperature only when the chassis controller 230 fails to do so.

In some implementations, the thermal control system 200 further includes a non-transitory memory 250 that stores temperature signals 252 of the temperature sensors 220. The air controller 244 accesses the stored temperature signals 252 from the non-transitory memory 250. Moreover, the chassis controller 230 obtains temperature signals 252 of the temperature sensors 220 from the memory 250 and determines the target air flow rate based on the stored temperature signals 252 to maintain the threshold temperature of the air volume of the chassis 210. The chassis controller 230 adjusts an air flow of the air mover 242 to move air at the target air flow rate, and it sends a heartbeat signal 232 to the air controller 244 indicating that it is in a healthy state.

Both the chassis controller 230 and the air controller 244 access the stored temperature signals 252 that are stored on the non-transitory memory 250. Although both the chassis controller 230 and the air controller 244 access the same stored temperature signals 252, the chassis controller 230 determines the target air flow rate based on the temperature signals 252, and only when the chassis controller 230 is in an unhealthy state does the air controller 244 control the air mover 242 based on the stored temperature signals 252. Therefore, at any time during which the air controller 244 is controlling the air mover 242, the chassis controller 230 can override that control by sending the air controller 244 a heartbeat 232.

The air controller 244 receives heartbeats 232 from the chassis controller 230, and only when the air controller 244 stops receiving heartbeats 232 (e.g., for a failure threshold time) from the chassis controller 230 does the air controller 244 take control of the air mover 242. Since the air controller 244 has access (e.g., the same access) to the temperature signals 252, the air controller 244 can maintain a calculated target air flow rate for the air mover(s) 242 and can instantly take control of the air mover(s) 242 without any or minimal start-up period, initialization time, or take-over time. As a result, the air controller 244 can maintain a seamless or near seamless operation of the air mover(s) 242 when taking over control from the chassis controller 230, thus maintaining a stable temperature of the chassis 210.

The air controller 244 may relinquish control of the air mover 242 back to the chassis controller 230 after receiving a heartbeat signal 232 again from the chassis controller 230. In some examples, the controller relinquishes control of the air mover 242 to the chassis controller 230 after receiving periodic heartbeat signals 232 again from the chassis controller 230 for a resume threshold period of time. The air controller 244 may send an acknowledgement signal 246 to the chassis controller 230 in response to receiving a heartbeat signal 232. If the chassis controller 230 fails to receive the acknowledgement signal 246, the chassis controller 230 issues an error indicating that the system 200 needs maintenance.

The air controller 244 and the chassis controller 230 share a temperature policy of maintaining a temperature of an air volume of the chassis 210 within a threshold temperature range by adjusting an air flow of the air mover 242. The air controller 244 may receive the temperature policy from the chassis controller 230.

The air controller 244 may monitor temperature signals 252 of the one or more temperature sensors 220 and may take control of the air mover 242 when a temperature of an air volume of the chassis 210 is outside a threshold temperature range (in addition to taking control when the air controller 244 does not receive a heartbeat 232 from the chassis controller 230). The air controller 244 may also determine a target air flow rate based on the temperature signal(s) 252 to maintain a threshold temperature of an air volume of the chassis 210 and may adjust an air flow of the air mover 242 to move air at the target air flow rate.

In some implementations, the air controller 244 may relinquish control of the air mover 242 back to the chassis controller 230 after two events occur. The first event occurs when the air controller 244 receives a heartbeat signal 232 from the chassis controller 230 or when the air controller 244 periodically receives heartbeat signals 232 for a resume threshold period of time from the chassis controller 230. The second event occurs when the temperature of the air volume of the chassis 210 is within the threshold temperature range. If the air controller 244 fails to receive a heartbeat signal 232 again from the chassis controller 230, the air controller 244 issues an error for system maintenance.

The air controller 244 and the chassis controller 230 may both access one or more temperature signals 252 from the non-transitory memory 250 that stores the temperature signals 252 of the one or more temperature sensors 220 and determine a target air flow rate based on the one or more temperature signals 252 to maintain a threshold temperature of an air volume of the chassis 210. The chassis controller 230 may adjust an air flow of the air mover 242 to move air at the target air flow rate and send a heartbeat signal 232 to the air controller 244 (signaling the air controller 244 that it is in command of the air mover(s) 242 and control by the air controller 244 is not needed at that time).

In some examples, the chassis controller 230 and the air controller 244 communicate via an I$^2$C bus (Inter-Integrated Circuit). The I$^2$C bus is a multi-master serial single-ended computer bus used for attaching low speed-peripherals to embedded systems, a motherboard, or other electronic device.

Figure 4:
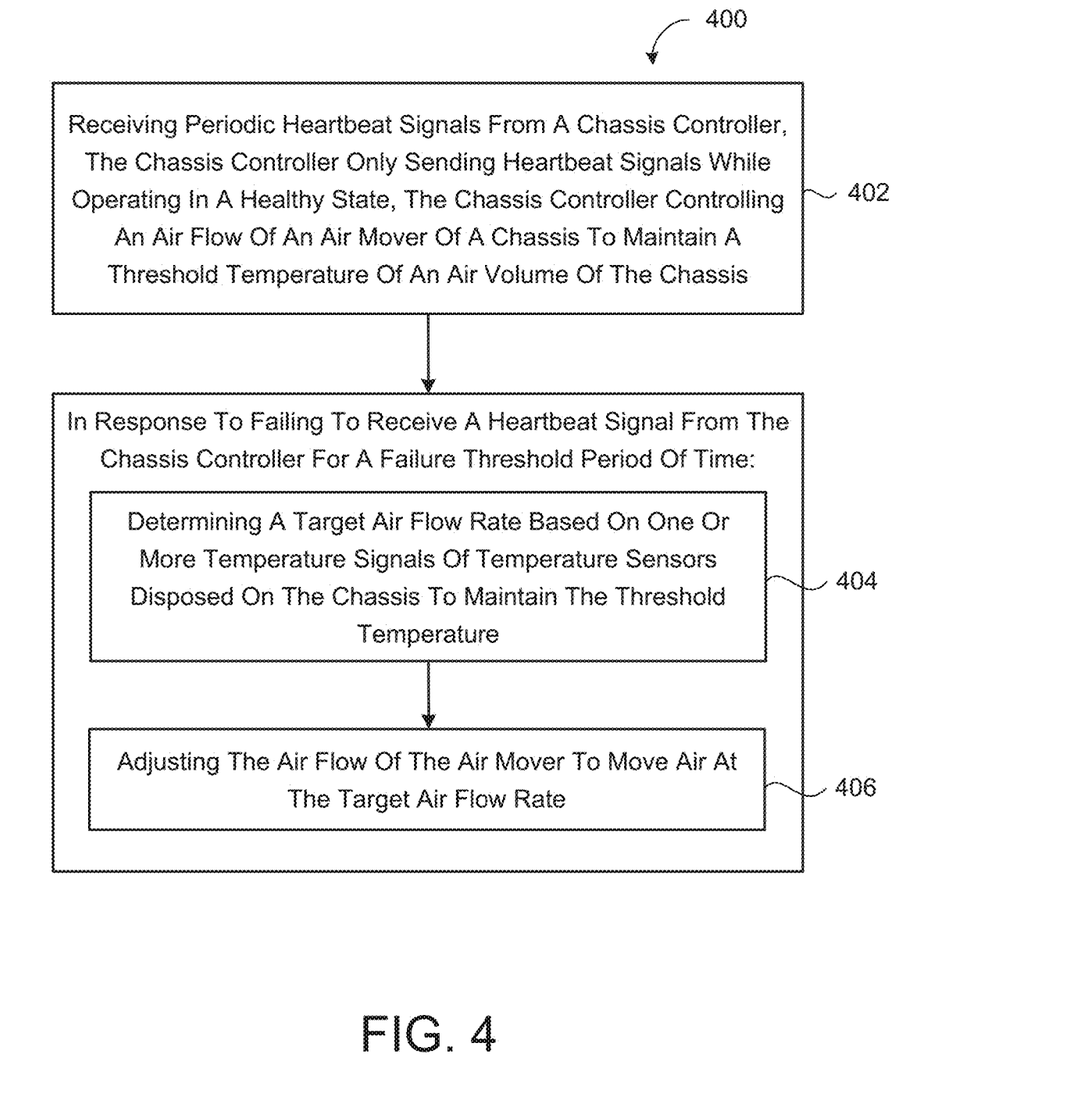
FIG. 4 is a schematic view of an exemplary arrangement of operations for a thermal control system.

FIG. 4 provides an exemplary arrangement of operation for a method 400 of temperature control. The method 400 includes receiving 402 periodic heartbeat signals 232 from a chassis controller 230. The chassis controller 230 only sends heartbeat signals 232 while operating in a healthy state. The chassis controller 230 controls an air flow of an air mover 242 of a chassis 210 to maintain a threshold temperature of an air volume of the chassis 210. In response to failing to receive a heartbeat signal 232 from the chassis controller 230 for a failure threshold period of time, the method includes determining 404 a target air flow rate based on one or more temperature signals of temperature sensors 220 disposed on the chassis 210 to maintain the threshold temperature and adjusting 406 the air flow of the air mover 242 to move air at the target air flow rate.

In some implementations, in response to failing to receive a heartbeat signal 232 from the chassis controller 230 for a failure threshold period of time, the method 400 may include adjusting the air flow of the air mover 242 to move air to maintain a temperature of the air volume of the chassis 210 within a threshold temperature range and/or the method 400 may include obtaining the temperature signals 252 from non-transitory memory 210, where the memory 250 stores temperature signals 252 of the one or more temperature sensors 220. The method 400 may send an acknowledgement signal 246 to the chassis controller 230 in response to receiving a heartbeat signal 232.

After failing to receive a heartbeat signal 232 from the chassis controller 230 for a failure threshold period of time, the method 400 may relinquish control of the air mover 242 to the chassis controller 230 after receiving a heartbeat signal 232 from the chassis controller 230. The method 400 may further include relinquishing control of the air mover 242 to the chassis controller 230 after receiving a heartbeat signal 232 from the chassis controller 230 for a resume threshold period of time.

In some implementations, the method 400 includes sharing a temperature policy with the chassis controller 230 of maintaining the threshold temperature of the air volume of the chassis 210 within a threshold temperature range by adjusting an air flow of the air mover 242. The method 400 may further include receiving the temperature policy from the chassis controller 230.

The method 400 may include monitoring temperature signals 252 of the one or more temperature sensors 220 and taking control of the air mover 242 when a temperature of the air volume of the chassis 210 is outside a threshold temperature range. The method 400 may also include determining a target air flow rate based on the one or more temperature signals 252 to maintain the threshold temperature of the air volume of the chassis 210 and adjusting an air flow of the air mover 242 to move air at the target air flow rate. In some examples, the method 400 further includes relinquishing control of the air mover 242 to the chassis controller 230 after receiving a heartbeat signal 232 from the chassis controller 230 or periodically receiving heartbeat signals 232 for a resume threshold period of time from the chassis controller 230, and the temperature of the air volume of the chassis 210 is within the threshold temperature range.

A number of implementations have been described. Nevertheless, it will be understood that various modifications may be made without departing from the spirit and scope of the disclosure. Accordingly, other implementations are within the scope of the following claims.

What is claimed is:

1. A system comprising:
a chassis;
one or more temperature sensors disposed on the chassis;
a chassis controller in communication with the one or more temperature sensors; and
an air mover module disposed on the chassis and comprising:
an air mover; and
an air controller in communication with the air mover, the one or more temperature sensors, and the chassis controller, the air controller receiving periodic heartbeat signals from the chassis controller while the chassis controller operates in a healthy state;
wherein the chassis controller controls the air mover based on temperature signals of the one or more temperature sensors while operating in the healthy state, and
wherein, when the air controller fails to receive any heartbeat signals from the chassis controller for a failure threshold period of time, the air controller takes control of the air mover and controls the air mover based on the temperature signals of the one or more temperature sensors.

2. The system of claim 1, wherein the air controller:
determines a target air flow rate based on one or more temperature signals of the one or more temperature sensors to maintain a threshold temperature of an air volume of the chassis; and
adjusts an air flow of the air mover to move air at the target air flow rate.

3. The system of claim 2, further comprising non-transitory memory storing temperature signals of the one or more temperature sensors, the air controller accessing the one or more temperature signals from the memory.

4. The system of claim 3, wherein the chassis controller:
obtains temperatures signals of the one or more temperature sensors from the memory;
determines a target air flow rate based on the one or more temperature signals to maintain a threshold temperature of an air volume of the chassis;
adjusts an air flow of the air mover to move air at the target air flow rate; and
sends a heartbeat signal to the air controller.

5. The system of claim 1, wherein the air controller relinquishes control of the air mover back to the chassis controller after receiving a heartbeat signal again from the chassis controller.

6. The system of claim 5, wherein the air controller relinquishes control of the air mover to the chassis controller after receiving periodic heartbeat signals again from the chassis controller for a resume threshold period of time.

7. The system of claim 1, wherein the air controller sends an acknowledgement signal to the chassis controller in response to receiving a heartbeat signal.

8. The system of claim 1, wherein the air controller and the chassis controller share a temperature policy of maintaining a temperature of an air volume of the chassis within a threshold temperature range by adjusting an air flow of the air mover.

9. The system of claim 8, wherein the air controller receives the temperature policy from the chassis controller.

10. The system of claim 1, wherein the air controller:
monitors temperature signals of the one or more temperature sensors;
takes control of the air mover when a temperature of an air volume of the chassis is outside a threshold temperature range;
determines a target air flow rate based on the one or more temperature signals to maintain a threshold temperature of an air volume of the chassis; and
adjusts an air flow of the air mover to move air at the target air flow rate.

11. The system of claim 10, wherein the air controller relinquishes control of the air mover to the chassis controller after:
receiving a heartbeat signal from the chassis controller or periodically receiving heartbeat signals for a resume threshold period of time from the chassis controller; and
the temperature of the air volume of the chassis is within the threshold temperature range.

12. The system of claim 10, further comprising non-transitory memory storing temperature signals of the one or more temperature sensors, the air controller accessing the one or more temperature signals from the memory.

13. The system of claim 12, wherein the chassis controller:
   accesses one or more temperature signals from the memory;
   determines a target air flow rate based on the one or more temperature signals to maintain a threshold temperature of an air volume of the chassis;
   adjusts an air flow of the air mover to move air at the target air flow rate; and
   sends a heartbeat signal to the air controller.

14. A method of temperature control, the method comprising:
   receiving periodic heartbeat signals from a chassis controller, the chassis controller only sending heartbeat signals while operating in a healthy state, the chassis controller controlling an air flow of an air mover of a chassis to maintain a threshold temperature of an air volume of the chassis; and
   in response to failing to receive a heartbeat signal from the chassis controller for a failure threshold period of time:
      determining a target air flow rate based on one or more temperature signals of temperature sensors disposed on the chassis to maintain the threshold temperature; and
      adjusting the air flow of the air mover to move air at the target air flow rate based on the temperature signals of the one or more temperature sensors.

15. The method of claim 14, further comprising, in response to failing to receive a heartbeat signal from the chassis controller for a failure threshold period of time, adjusting the air flow of the air mover to move air to maintain a temperature of the air volume of the chassis within a threshold temperature range.

16. The method of claim 14, further comprising, in response to failing to receive a heartbeat signal from the chassis controller for a failure threshold period of time, obtaining the temperature signals from non-transitory memory, the memory storing temperature signals of the one or more temperature sensors.

17. The method of claim 14, further comprising, in response to receiving a heartbeat signal, sending an acknowledgement signal to the chassis controller.

18. The method of claim 14, further comprising, after failing to receive a heartbeat signal from the chassis controller for a failure threshold period of time, relinquishing control of the air mover to the chassis controller after receiving a heartbeat signal from the chassis controller.

19. The method of claim 18, further comprising relinquishing control of the air mover to the chassis controller after receiving a heartbeat signal from the chassis controller for a resume threshold period of time.

20. The method of claim 14, further comprising sharing a temperature policy with the chassis controller of maintaining the threshold temperature of the air volume of the chassis within a threshold temperature range by adjusting an air flow of the air mover.

21. The method of claim 20, further comprising receiving the temperature policy from the chassis controller.

22. The method of claim 14, further comprising:
   monitoring temperature signals of the one or more temperature sensors;
   taking control of the air mover when a temperature of the air volume of the chassis is outside a threshold temperature range;
   determining a target air flow rate based on the one or more temperature signals to maintain the threshold temperature of the air volume of the chassis; and
   adjusting an air flow of the air mover to move air at the target air flow rate.

23. The method of claim 22, further comprising relinquishing control of the air mover to the chassis controller after:
   receiving a heartbeat signal from the chassis controller or periodically receiving heartbeat signals for a resume threshold period of time from the chassis controller; and
   the temperature of the air volume of the chassis is within the threshold temperature range.

* * * * *